US008899565B2

(12) United States Patent
Kim

(10) Patent No.: US 8,899,565 B2
(45) Date of Patent: Dec. 2, 2014

(54) SPUTTERING DEVICE WITH GAS INJECTION ASSEMBLY

(75) Inventor: Sung Eun Kim, Ulsan (KR)

(73) Assignee: LG Display Co., Ltd., Seoul (KR)

( * ) Notice: Subject to any disclaimer, the term of this patent is extended or adjusted under 35 U.S.C. 154(b) by 1212 days.

(21) Appl. No.: 12/797,422

(22) Filed: Jun. 9, 2010

(65) Prior Publication Data

US 2010/0243436 A1 Sep. 30, 2010

Related U.S. Application Data

(62) Division of application No. 11/165,446, filed on Jun. 24, 2005, now abandoned.

(30) Foreign Application Priority Data

Aug. 30, 2004 (KR) .................. 10-2004-0068696

(51) Int. Cl.
*C23C 14/50* (2006.01)
(52) U.S. Cl.
CPC ..................................... *C23C 14/50* (2013.01)
USPC .............. 269/58; 269/50; 269/20; 156/345.1; 156/345.23; 156/345.54; 118/728; 118/500; 204/298.07; 204/298.15

(58) Field of Classification Search
USPC ................ 204/298.07, 298.15; 118/500, 728; 269/55, 58, 20; 156/345.1, 345.23
See application file for complete search history.

(56) References Cited

U.S. PATENT DOCUMENTS

| | | | |
|---|---|---|---|
| 3,797,889 A * | 3/1974 | Wilkinson | 406/34 |
| 4,030,997 A | 6/1977 | Miller et al. | |
| 4,392,915 A * | 7/1983 | Zajac | 438/716 |
| 4,426,267 A | 1/1984 | Munz et al. | |
| 5,053,355 A | 10/1991 | von Campe | |
| 6,732,855 B1 * | 5/2004 | Lering et al. | 198/782 |
| 2003/0233768 A1 * | 12/2003 | Kaeppeler | 34/560 |

FOREIGN PATENT DOCUMENTS

CN 1697767 A 11/2005

* cited by examiner

*Primary Examiner* — Jason M Berman
(74) *Attorney, Agent, or Firm* — McKenna Long & Aldridge LLP

(57) ABSTRACT

A sputtering device includes a chamber; and a substrate transferring unit for loading a substrate into, or unloading the substrate from the chamber, the substrate transferring unit including a gas injection assembly forming a gas cushion between the substrate and an upper surface of the substrate transferring unit.

12 Claims, 4 Drawing Sheets

SPUTTERING DEVICE WITH GAS INJECTION ASSEMBLY

CROSS-REFERENCE TO RELATED APPLICATIONS

This application is a Divisional of application Ser. No. 11/165,446 filed Jun. 24, 2005, now abandoned, which claims priority to Korean Patent Application No. 10-2004-0068696, filed Aug. 30, 2004, all of which are hereby incorporated by reference for all purposes as if fully set forth herein.

BACKGROUND OF THE INVENTION

1. Field of the Invention

The present invention relates to a sputtering device, and more particularly, to a sputtering device with a gas injection assembly.

2. Description of the Related Art

In recent years, as cutting edge electronic devices, such as liquid crystal devices (LCD), become light and thin, components mounted in these devices also become smaller. So does the distance between adjacent components. In order to form a minute line between each component, various methods for forming a thin film have been proposed, for example a sputtering method. The sputtering method will be explained as follows.

First, a substrate on which a thin film is to be formed is loaded inside a vacuum chamber using a substrate transferring device. Then, a specific pressure and a voltage are supplied to an inactive gas inside the vacuum chamber, to generate a plasma around a target. Positive ions in the plasma formed around the target hit a surface of the target with an electric force. Also, the positive ions in the plasma transfer their kinetic energy to atoms on the surface of the target. When the transferred kinetic energy is greater than a bonded energy between the hit atoms, the atoms on the surface of the target are emitted from the target to be deposited onto the substrate.

FIG. 1 is a schematic view of a magnetron sputtering device according to the related art. Referring to FIG. 1, a sputtering device 1 includes a vacuum chamber 10, a vacuum pump 30 for maintaining a vacuum state inside the vacuum chamber 10, a supporter 40 for supporting a substrate to be sputtered, and a plasma generating unit 20 for generating a plasma in the vacuum chamber 10. The plasma generating unit 20 includes a target 21 formed of aluminum (Al), aluminum alloy (AlNd), chrome (Cr), molybdenum (Mo), etc., depending on the type of thin film to be formed, a cathode plate 23 for fixing the target 21, a magnet 25 for generating a magnetic field at rear surfaces of the target 21 and the cathode plate 23. The magnet 25 collects plasma between the target 21 and a substrate 29 into a periphery of the target 21, and increases the ion generating ratio on the target 21. The supporter 40 is provided with a supporting unit 27. The substrate 29 is transferred by a substrate transferring robot hand (not shown) to adhere and be fixed to the supporting unit 27.

An inactive gas, such as Ar, is injected into the vacuum chamber 10 of the sputtering device. Then, the inactive gas is discharged and excited into a plasma state, in which positive ions and negative ions are mixed together. Also, a DC pulse is applied to the cathode plate 23. Thus, a negative high voltage is applied to the target 21. Ionized inactive gas (Ar$^+$) is accelerated towards the target 21. Because the ions accelerated towards the target 21 have more than several tens of KeV of kinetic energy, the ions partially transfer their kinetic energy to atoms on the surface of the target when they collide with the target 21. The atoms on the target 21 are freed from the surface of the target 21 in the form of negative ions. The negative ions from the target 21 are quickly deposited onto the substrate 29 by an electric field and a magnetic field, and form a film on the substrate 29.

However, in the related art sputtering device, the substrate and the supporter are fixed to each other. The contact between the rear surface of the substrate and the supporter may cause a back scratch, or cause the substrate to break. Especially, during loading or unloading of the substrate into/from the vacuum chamber, when the substrate goes through a region where the vacuum state is replaced by an atmospheric state, the entire substrate is not constantly moved due to an unstable air stream. Accordingly, the substrate may be damaged. Moreover, in the related art sputtering device, a substrate that has been horizontally transferred by a substrate transferring unit, such as a robot hand, is again transferred onto a substrate supporter inside a sputtering chamber.

SUMMARY OF THE INVENTION

Accordingly, the present invention is directed to a sputtering device with a gas injection assembly that substantially obviates one or more of the problems due to limitations and disadvantages of the related art.

An object of the present invention is to provide a sputtering device capable of preventing a back scratch of a glass substrate.

Another object of the present invention is to provide a sputtering device capable of preventing damage to a fragile glass substrate.

To achieve these and other advantages and in accordance with the purpose of the present invention, as embodied and broadly described herein, a sputtering device includes a chamber; and a substrate transferring unit for loading a substrate into, or unloading the substrate from the chamber, the substrate transferring unit including a gas injection assembly forming a gas cushion between the substrate and an upper surface of the substrate transferring unit.

In another aspect, a substrate transferring unit for a sputtering device includes a supporting unit supporting a substrate; a fixing unit fixing one side of the substrate to the supporting unit; and a gas injection assembly on an upper surface of the supporting unit, the gas injection assembly forming a gas cushion between the substrate and the upper surface of the supporting unit.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
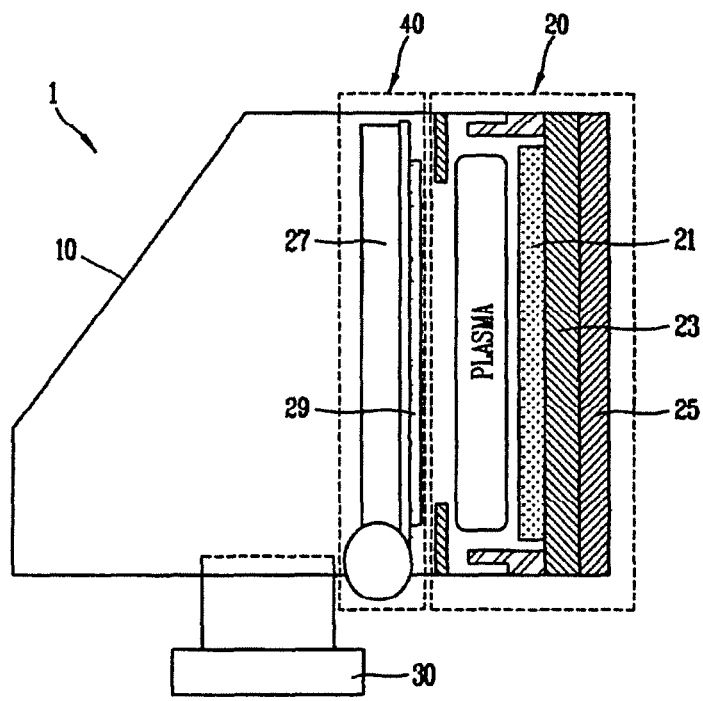
FIG. 1 is a schematic view of a magnetron sputtering device according to the related art.
Figure 2:
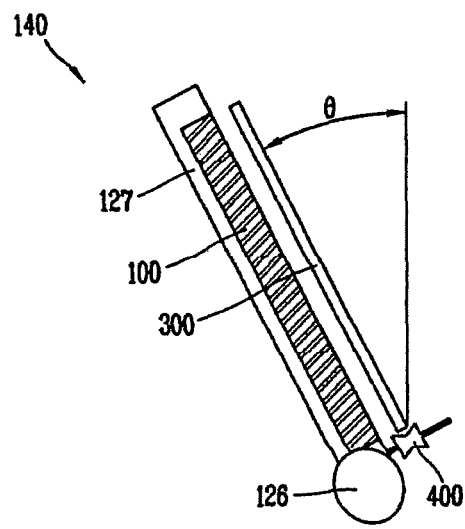
FIG. 2 is a view of an exemplary substrate transferring unit according to an embodiment of the present invention.

FIG. 2 is a view of an exemplary substrate transferring unit according to an embodiment of the present invention. Referring to FIG. 2, a substrate transferring unit 140 includes a supporting unit 127 for supporting a substrate 300, a fixing unit 400 for fixing one side of the substrate 300 to the supporting unit 127, and a roller 126 for moving the substrate transferring unit 140. When loading/unloading the substrate 300 into/from a chamber (not shown), and when depositing a thin film in the chamber, the substrate transferring unit 140 is inclined by a specific angle (Θ) with respect to the vertical direction.

The supporting unit 127 is provided with a gas injection assembly 100. The gas injection unit 100 injects gas onto an upper surface of the supporting unit 127 when loading the substrate 300 on the substrate transferring unit 140, when loading/unloading the substrate transferring unit 140 with the substrate 300 into/from the chamber of the sputtering device, and when coating a thin film on the substrate 300 after it has been loaded into the chamber. The gas injection assembly 100 forms a gas cushion having a specific thickness by consecutively injecting and sucking gas into/from a front surface of the supporting unit 127.

The substrate 300 is loaded on the front surface of the substrate supporting unit 127. A lower portion of the substrate 300 is fixed to the supporting unit 127 by the fixing unit 400. Then, the substrate 300 is lifted above the supporting unit 127 by the gas cushion underneath to be stably transferred.

In the sputtering device according to an embodiment of the present invention, the transfer of the substrate and the formation of the thin film are performed while the substrate is mounted on the substrate transferring unit. That is, the thin film is formed on the substrate while the substrate transferring unit is loaded into the chamber of the sputtering device. Moreover, the substrate is unloaded while the substrate transferring unit is moved out of the chamber after the formation of the thin film. The substrate 300 may later be included in a liquid crystal display device (not shown).

Figure 3:
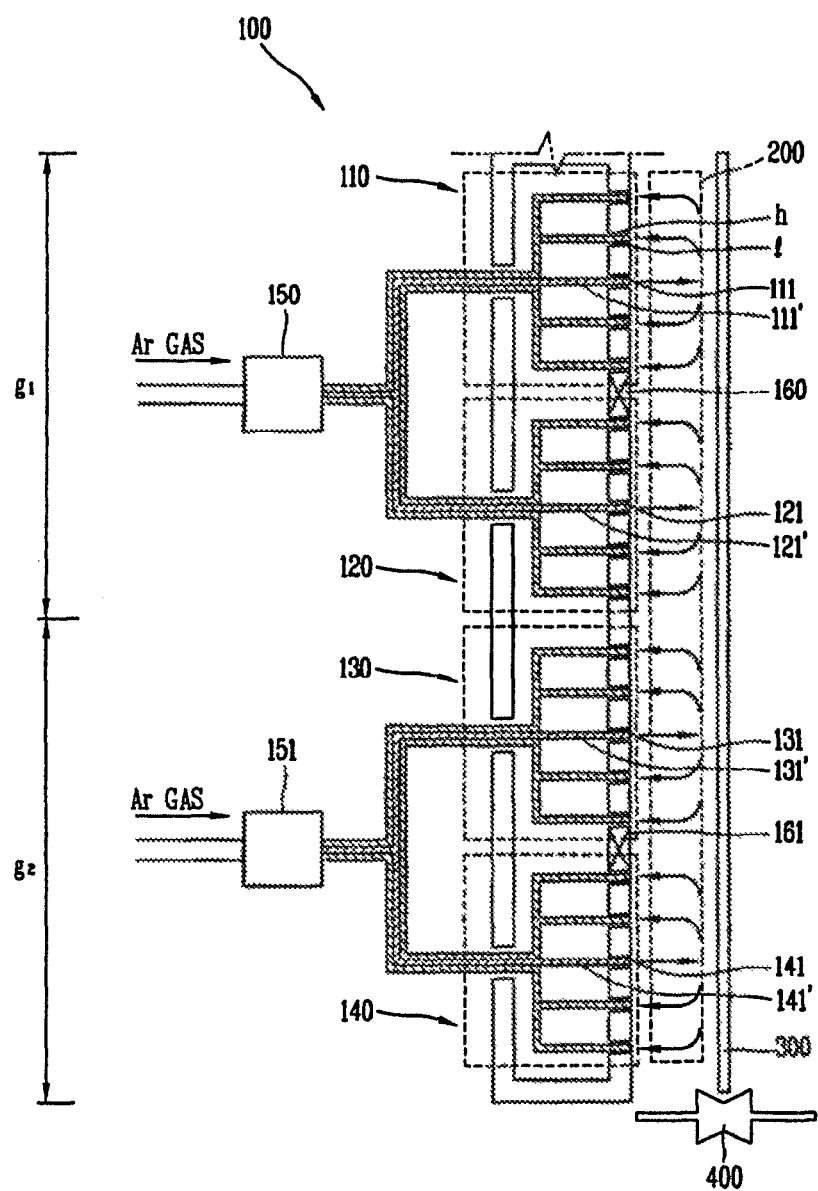
FIG. 3 is a cross-sectional view of an exemplary gas injection assembly on the substrate transferring unit in FIG. 2 in accordance with an embodiment of the present invention.

FIG. 3 is a cross-sectional view of an exemplary gas injection assembly on the substrate transferring unit in FIG. 2 in accordance with an embodiment of the present invention. Referring to FIG. 3, a gas injection assembly 100 includes a plurality of gas injection nozzles 110, 120, 130, and 140, a plurality of gas flow amount controllers 150 and 151, and distance detecting sensors 160 and 161. The nozzles 110, 120, 130, and 140 generate a gas cushion 200 at a front surface of each of the nozzles by injecting gas and then sucking the gas. The gas flow amount controllers 150 and 151 partially control a gas flow amount to form the gas cushion 200. The distance detecting sensors 160 and 161 are attached to the surface of the gas injection assembly 100 and detect a distance between the gas injection nozzles 110, 120, 130, and 140 and the substrate 300 on which a thin film is to be formed. As described above, a lower portion in the substrate 300 is fixed to the supporting unit by the fixing unit 400.

The gas injection nozzle 110 includes a gas injection pipe 111' for receiving gas from the gas flow amount controller 150 of a nozzle group g1 and supplying the gas, an injection opening 111 for injecting the supplied gas, a plurality of inlets h arranged around the injection opening 111 for sucking gas injected from the injection opening 111 and circulating the gas, and gas exhaustion pipes l. The injection opening 111 is positioned in the middle of the gas injection nozzle 110. The inlets h are radially formed around the injection opening 111.

In FIG. 3, gas is injected into each of the gas flow amount controllers 150 and 151. The injected gas can be an inactive gas, such as Ar. Gas flows from the gas amount controller 150 into the gas injection pipes 111', 121', 131', and 141'. The flowing gas is injected through the injection openings 111, 121, 131, and 141 of the gas injection nozzles 110, 120, 130, and 140. Then, the injected gas is sucked into the inlets h and is expelled through the gas exhaustion pipes l.

Because the injected gas forms the gas cushion 200 between the front surface of the gas injection assembly 100 and the substrate 300, substrate damage due to contact between the substrate 300 and the supporting unit 127 can be prevented. Specifically, because the substrate 300 is loaded onto the gas cushion 200 formed on the front surface of the gas injection assembly 100, the substrate 300 is stably lifted above the supporting unit by the gas cushion 200. Thus, a back scratch is not generated on the back surface of the substrate.

Nozzle group g1 in the gas injection assembly 100 includes at least two nozzles 110 and 120. Nozzle group g2 in the gas injection assembly 100 includes at least two nozzles 130 and 140. The number of nozzles in each nozzle group can be eight, for example. Each of the nozzle groups g1 and g2 is provided with one gas flow amount controller 150 and 151, respectively. Each of the nozzle groups g1 and g2 is also provided with at least one distance detecting sensor 160 and 161, respectively, to individually control a distance between the substrate 300 and the supporting unit 127.

The distance detecting sensors 160 and 161 are general optical sensors and are attached to the front surface of the gas injection assembly 100 to measure a distance between the substrate 300 on which a thin film is to be deposited and the gas injection assembly 100 in the sputtering device. The optical sensor is provided with a light emitting portion and a light receiving portion. Light irradiated on the surface of the substrate 300 from the light emitting portion is reflected, then detected by the light receiving portion to measure the distance between the nozzle and the substrate.

The distance detecting sensor 160 measures the distance between the substrate 300 and the supporting unit in a region corresponding to the nozzle group g1. The distance detecting sensor 161 measures the distance between the substrate 300 and the supporting unit in a region corresponding to the nozzle group g2. The measured distance values are transmitted to the gas flow amount controllers 150 and 151, which control the gas flow amount based on the measured distance values.

A gas cushion with a uniform thickness is formed on the supporting unit to maintain a uniform gap of approximately 5-10 mm between the nozzle on the supporting unit 127 and the substrate 300. For example, when the distance between a nozzle 110 or 120 in a nozzle group g1 and the substrate 300 is more than a reference value, the gas flow amount supplied per unit time by the gas flow amount controller 150 is decreased, thus decreasing the thickness of the gas cushion between the nozzle 110 or 120 and the substrate 300. Hence, the gap between the nozzle 110 or 120 and the substrate 300 is decreased. When the distance between the nozzle 110 or 120 and the substrate is less than a reference value, the gas flow amount supplied per unit time by the gas flow amount controller 150 is increased to increase the thickness of the gas cushion between the nozzle 110 or 120 and the substrate 300. Hence, the gap between the nozzle 110 or 120 and the substrate 300 is increased. A similar process is applied to nozzles 130 and 140 in nozzle group g2.

Figure 4:
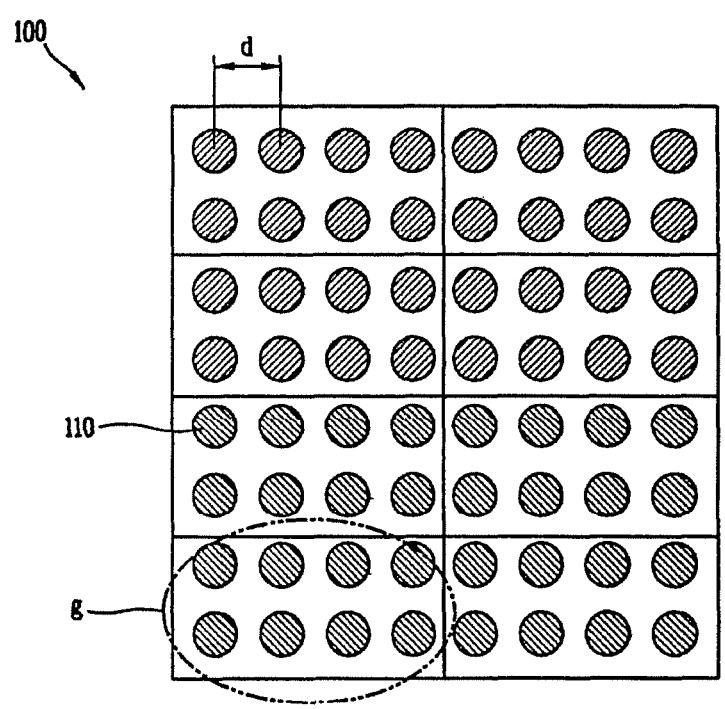
FIG. 4 is a front view of an exemplary gas injection assembly according to an embodiment of the present invention.

FIG. 4 is a front view of an exemplary gas injection assembly according to an embodiment of the present invention. Referring to FIG. 4, gas injection nozzles 110 respectively having a circular cross section are arranged left to right and top to bottom on the surface of the gas nozzle assembly 100. A gap d between adjacent gas injection nozzles 110 is approximately 10 mm or less. At least two gas injection nozzles 110 adjacent to each other in up and down directions or in left and right directions, or in up, down, right and left directions are grouped together to form a group g. The at least two gas injection nozzles 110 in the group g are controlled by an individual control system composed of one gas flow amount controller 150 (shown in FIG. 3) and at least one distance detecting sensor 160 (shown in FIG. 3). In FIG. 4, eight gas injection nozzles constitute one nozzle group g. However, in other embodiments of the present invention, the number of gas injection nozzles 110 can have other values.

In an embodiment of the present invention, since each nozzle group g is individually formed, the nozzle groups g can be added to the gas injection assembly 100 or removed from the gas injection assembly 100 when necessary. For example, when the substrate 300 is large, additional nozzle groups g may be added to the gas injection assembly 100. In contrast, when the substrate 300 is small, excess nozzle groups g may be removed from the gas injection assembly 100.

Figure 5:
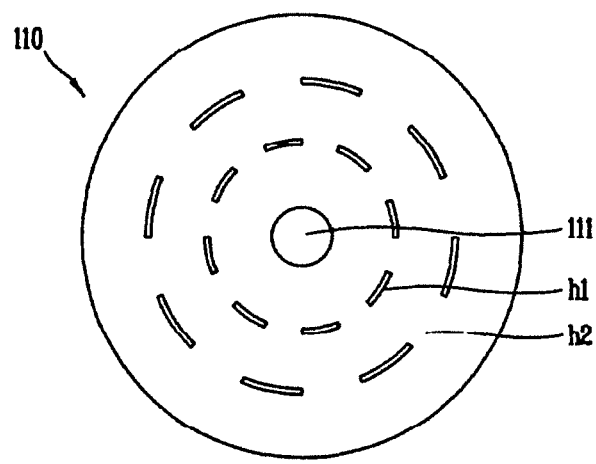
FIG. 5 is a detailed enlarged view of the gas injection nozzle shown in FIG. 4 according to an embodiment of the present invention.

FIG. 5 is a detailed enlarged view of the gas injection nozzle shown in FIG. 4 according to an embodiment of the present invention. Referring to FIG. 5, the gas injection opening 111 (shown in FIG. 3) is arranged in the central portion of the gas injection nozzle 110, and a plurality of inlets h1 and h2 are radially formed around the gas injection opening 111. The first inlets h1 are spaced from the gas injection opening 111 by a first distance, and the second inlets h2 are spaced from the gas injection opening 111 by a second distance. Gas injected from the gas injection opening 111 is continually sucked into the first inlets h1 and the second inlets h2 radially arranged. The gas is expelled and to form a gas cushion on the supporting unit 127 (shown in FIG. 2) to protect the loaded glass substrate 300.

Figure 6:
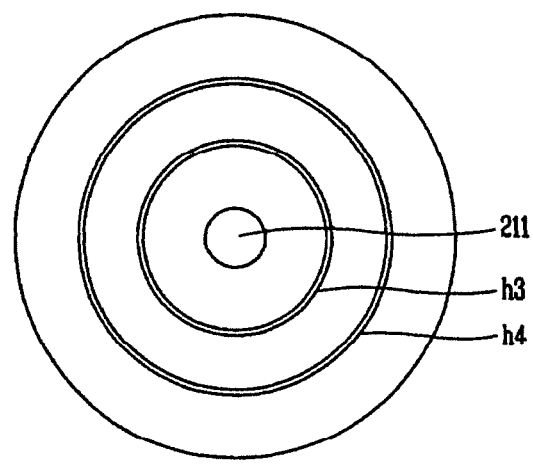
FIG. 6 is a detailed enlarged view of the gas injection nozzle shown in FIG. 4 according to another embodiment of the present invention.

FIG. 6 is a detailed enlarged view of the gas injection nozzle shown in FIG. 4 according to another embodiment of the present invention. Referring to FIG. 6, the gas injection nozzle may be provided with a first ring-shaped inlet h3 and a second ring-shaped inlet h4. The first ring-shaped inlet h3 is spaced from a gas injection opening 211 with a first distance and the second ring-shaped inlet h4 is spaced from the gas injection opening 211 with a second distance. In embodiments of the present invention, the shape and the number of gas injection nozzles are not limited.

In an embodiment of the present invention, the gas injection assembly is formed of a material that is not damaged by the gas flowing through the nozzle or the gas inside the chamber of the sputtering device. For example, the gas injection assembly may be formed of an opaque material such as ceramic, fused quartz, or polymer.

In an embodiment of the present invention, the gas injection assembly is mounted on the substrate transferring unit of the sputtering device so that the substrate transferring unit does not contact the substrate. Thus, degradation of the substrate due to contact between the substrate and the supporting unit is prevented.

In the related art, when loading or unloading the substrate into/from the vacuum chamber, when the substrate passes through a region where the vacuum state is replaced by an atmospheric state, the entire substrate does not move at a constant speed because of an unstable air stream, and may be damaged. In contrast, in an embodiment of the present invention, substrate damage is effectively prevented.

It will be apparent to those skilled in the art that various modifications and variations can be made in the sputtering device with gas injection assembly of the present invention without departing from the spirit or scope of the invention. Thus, it is intended that the present invention cover the modifications and variations of this invention provided they come within the scope of the appended claims and their equivalents.

What is claimed is:

1. A sputtering device, comprising:
a chamber; and
a substrate transferring unit for loading a substrate into, or unloading the substrate from the chamber, the substrate transferring unit comprising a supporting unit for supporting the substrate, and a gas injection assembly mounted on the supporting unit and forming a gas cushion between the substrate and an upper surface of the substrate transferring unit,
wherein the gas injection assembly comprises:
a plurality of nozzle groups including a plurality of gas injection nozzles, the gas injection nozzles including an injection opening and a plurality of inlets arranged around the injection opening;
gas flow amount controllers spaced from the gas injection nozzles with a certain interval; and
at least one distance detecting sensor attached to a front surface of the gas injection assembly and provided at each of the nozzle groups, respectively, to individually measure a corresponding distance between the substrate and corresponding gas injection nozzles,
wherein a height of the gas cushion is controlled based upon the measured distance and the gas flow amount controllers.

2. The sputtering device of claim 1, wherein the gas injection unit injects gas onto the upper surface of the supporting unit when loading the substrate on the substrate transferring unit, when loading/unloading the substrate transferring unit with the substrate into/from the chamber of the sputtering device, and when coating the thin film on the substrate.

3. The device of claim 1, wherein the gas injection assembly individually controls a gas injection amount by detecting a distance between the substrate and the gas injection nozzles of the corresponding nozzle group.

4. The device of claim 1, wherein the substrate transferring unit further comprises a fixing unit for fixing only a lower side of the substrate to the supporting unit and a roller for moving the substrate transferring unit.

5. The device of claim 3, wherein
the substrate transferring unit is inclined by an angle with respect to a vertical direction when loading/unloading the substrate into/from the chamber, and when depositing a thin film on the substrate.

6. The device of claim 1, wherein the at least one nozzle group individually controls a gas flow amount inside the gas injection assembly by using a corresponding gas flow amount controller and a corresponding distance detecting sensor.

7. The device of claim 1, wherein the gas injection nozzle has a circular cross-section.

8. The device of claim 1, wherein the injection opening is positioned in a middle of the gas injection nozzle and the inlets are radially formed around the injection opening.

9. The device of claim 1, wherein the injection opening has a gap between adjacent injection openings is about 10 mm or less.

10. The device of claim 1, wherein the plurality of inlets includes:
- a plurality of first inlets radially formed around the injection opening at a first distance from the injection opening; and
- a plurality of second inlets radially formed around the injection opening at a second distance from the injection opening.

11. The device of claim 1, wherein the plurality of inlets includes:
- a first ring-shaped inlet surrounding the injection opening at a first distance from the injection opening; and
- a second ring-shaped inlet surrounding the injection opening at a second distance from the injection opening.

12. The device of claim 1, wherein the gas injection nozzle further includes:
- a gas injection pipe connected to the injection opening for supplying gas to the substrate through the injection opening; and
- a gas exhaustion pipe connected to the inlet for exhausting gas through the inlet.

* * * * *